United States Patent [19]

Murata

[11] Patent Number: 5,228,966
[45] Date of Patent: Jul. 20, 1993

[54] GILDING APPARATUS FOR SEMICONDUCTOR SUBSTRATE

[75] Inventor: Satoshi Murata, Tokyo, Japan

[73] Assignee: NEC Corporation, Japan

[21] Appl. No.: 823,158

[22] Filed: Jan. 21, 1992

[30] Foreign Application Priority Data

Jan. 31, 1991 [JP] Japan .................. 3-32113

[51] Int. Cl.⁵ .................. C25D 17/00; C25D 17/06
[52] U.S. Cl. .................. 204/224 R; 204/225;
204/284; 204/297 M; 204/275
[58] Field of Search .......... 204/224 R, 297 R, 297 M,
204/275-278, 225, 284

[56] References Cited

U.S. PATENT DOCUMENTS

| | | | |
|---|---|---|---|
| 3,536,594 | 10/1970 | Pritchard | 204/275 X |
| 3,763,027 | 10/1973 | Pearson | 204/275 X |
| 4,240,880 | 12/1980 | Tsuchibuchi et al. | 204/224 R X |
| 4,339,319 | 7/1982 | Aigo | 204/275 X |
| 4,971,676 | 11/1990 | Doue et al. | 204/297 R X |
| 5,078,852 | 1/1992 | Yee et al. | 204/297 R |

Primary Examiner—Donald R. Valentine
Attorney, Agent, or Firm—Laff, Whitesel, Conte & Saret

[57] ABSTRACT

According to this invention, a cathode electrode is brought into reliable contact with a semiconductor substrate. A cup-like tank is arranged independently of an outer tank, and adjusting mechanisms are arranged on the cup-like tank for supporting the semiconductor and a head for supporting a cathode electrode, respectively. The adjusting mechanisms keep the semiconductor substrate and the cathode electrode to be horizontal, and the semiconductor substrate and the cathode electrode are brought into reliable contact with each other.

8 Claims, 6 Drawing Sheets

GILDING APPARATUS FOR SEMICONDUCTOR SUBSTRATE

BACKGROUND OF THE INVENTION

The present invention relates to a structure of a gilding apparatus for performing a gilding treatment by jetting a gilt liquid in a metalizing step of a semiconductor substrate.

In a conventional gilding apparatus of this type, as shown in FIGS. 4A, 4B, and 5, a cup-like tank 2 has a gilt liquid supply port 3, an anode electrode 5, and a semiconductor substrate support member 18, and the cup-like tank 2 is integrated with an outer tank 1. A gilt liquid 11 having a temperature controlled by a pump 9 is supplied from the gilt liquid supply port 3 to the cup-like tank 2 through a filter 8, and the gilt liquid 11 is jetted through the anode electrode 5. A semiconductor substrate 6 having a lower surface to be treated is supported by the semiconductor substrate support member 18 to be close to an upper opening 2a of the cup-like tank 2. A head member 10 vertically moved by a lifting mechanism member 17 through a base plate 16 is moved downward to be set and brought into contact with the semiconductor substrate 6, and a cross-shaped and leaf-spring-like cathode electrode 4e (shown in FIG. 4B) arranged on the heat member 10 is brought into contact with the semiconductor substrate 6 and is urged against the lower surface of the semiconductor substrate 6. A potential difference is applied between the anode electrode 5 and the cathode electrode 4e, thereby performing a gilding treatment.

In another structure, as shown in FIG. 6, a pin-like cathode electrode 4f is brought into contact with and urged against a semiconductor substrate 6 by elastic forces of springs, and a potential difference is applied between the anode electrode 5 and the cathode electrode 4f, thereby performing a gilding treatment.

In the above conventional gilding apparatus, since the cathode electrode using an elastic force of a spring is used as the contact portion on the cathode side, the elastic force does not easily have uniformity and resistances of the contact portions between a plurality of spring-like cathode electrodes and the semiconductor substrate are different from each other. When a gilding treatment is performed in this state, a gilt thickness is increased near a position having a low contact resistance, and a gilt thickness is decreased near a position having a high contact resistance, thereby varying the gilt thickness on the plated surface of the semiconductor substrate. Furthermore, a surface with which the cathode electrodes are in contact and which is to be plated tends to be plated thick, and the gilt thickness is disadvantageously varied.

SUMMARY OF THE INVENTION

It is an object of the present invention to provide a gilding apparatus capable of performing a gilding treatment at a high accuracy by eliminating variations in gilt thickness of a semiconductor substrate.

It is another object of the present invention to provide a gilding apparatus for reducing variations in contact resistance between a semiconductor substrate and a cathode electrode.

In order to achieve the above objects of the present invention, there is provided a gilding apparatus for a semiconductor substrate, comprising a cup-like tank for jetting a gilt liquid from a gilt liquid supply port formed in a bottom portion of the cup-like tank through an anode electrode, a substrate support member on which a semiconductor substrate having a lower surface to be treated is mounted to be close to an upper opening of the cup-like tank, a cathode electrode having the same area as that of the semiconductor substrate and brought into contact with the semiconductor substrate mounted on the substrate support member from an upper direction, and an adjusting mechanism for keeping the cathode electrode and the semiconductor mounted on the substrate support member to be relatively horizontal.

DETAILED DESCRIPTION OF THE PREFERRED EMBODIMENTS

The present invention will be described below with reference to the accompanying drawings.

Figure 1:
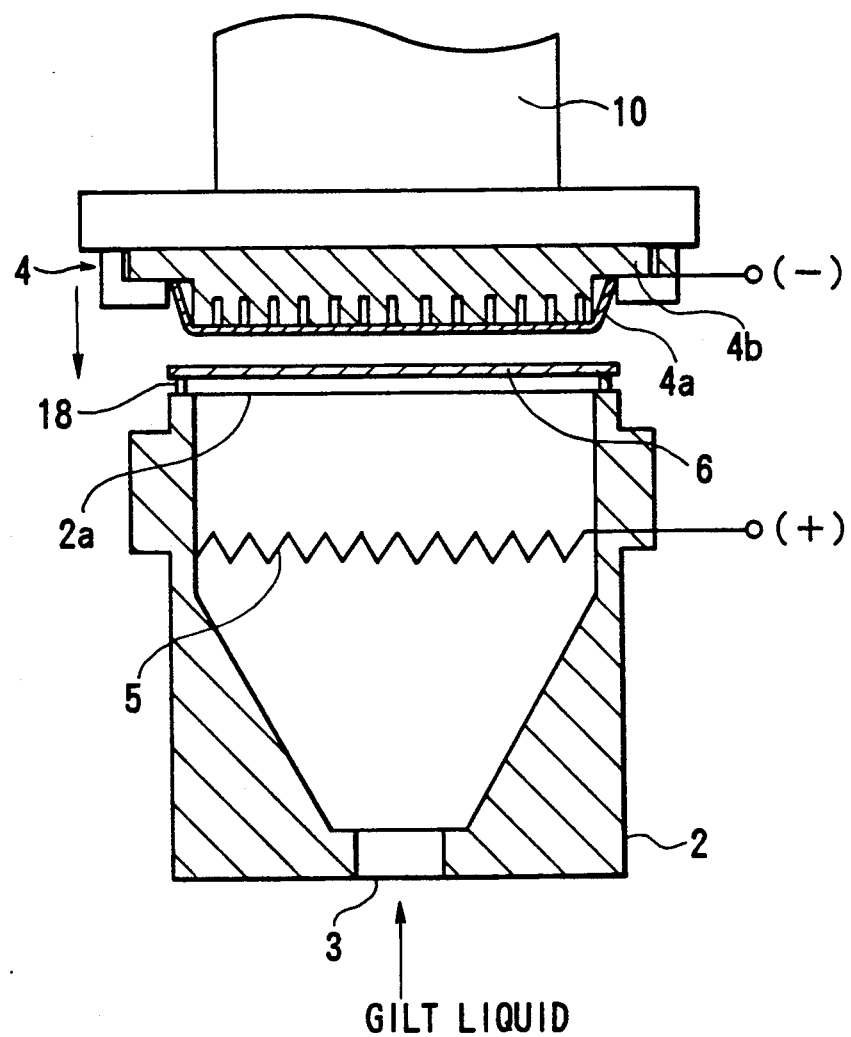
FIG. 1 is a cross-sectional view showing a gilding apparatus according to the first embodiment of the present invention.
Figure 2:
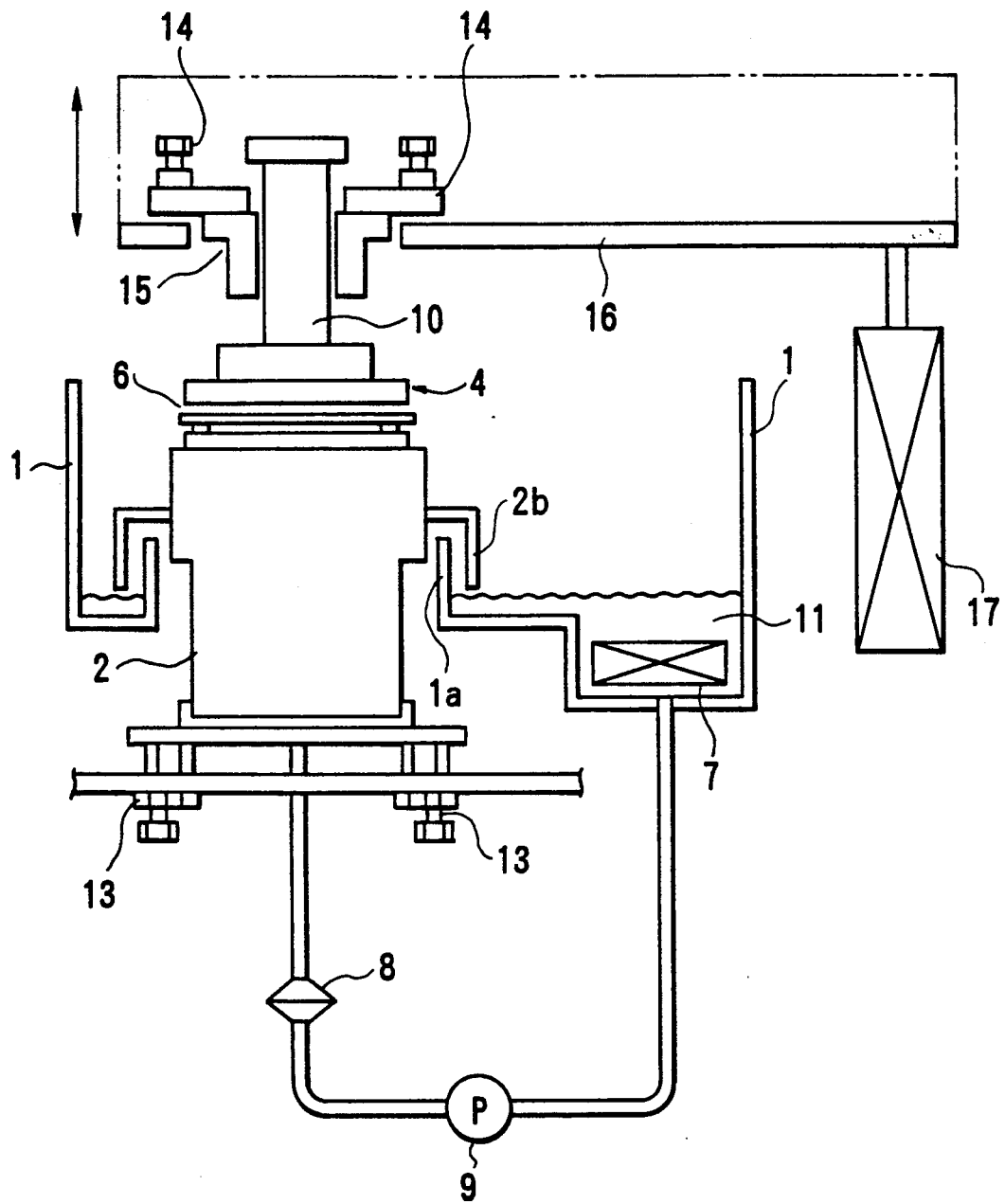
FIG. 2 is a view showing an overall arrangement of the first embodiment of the present invention.

FIGS. 1 and 2 are views showing the first embodiment of the present invention. In FIGS. 1 and 2, an outer tank 1 is filled with a gilt liquid 11, and the gilt liquid 11 is heated by a heater 7 to have a predetermined temperature. The gilt liquid 11 having a controlled temperature is supplied from a gilt liquid supply port 3 to a cup-like tank 2 by a pump 9 and jetted through an anode electrode 5 arranged in the cup-like tank 2. At this time, a semiconductor substrate 6 is supported by a semiconductor substrate support member 18 which is fixed to the cup-like tank 2 to be close to an upper opening 2a of the cup-like tank 2, and the semiconductor substrate 6 has a lower surface to be treated. A head member 10 having a cathode electrode 4 is moved downward by a lifting member 17 to cause the cathode electrode 4 to be brought into contact with the rear surface of the semiconductor substrate 6, and a potential difference is applied between the anode electrode 5 and the cathode electrode 4.

As shown in FIG. 2, in this embodiment, the cup-like tank 2 and the outer tank 1 are independently arranged, and the outer tank 1 has a circular upright portion 1a at the opening edge of a position at which the cup-like tank 2 is arranged. A circular skirt portion 2b having a diameter larger than that of the uprightportion 1a is formed on the outer periphery of the cup-like tank 2 to be suspended. An adjusting mechanism 13 for horizontally adjusting the overflow surface of the cup-like tank 2 is arranged on the bottom portion of the cup-like tank 2. The cathode electrode 4 is supported by the head member 10 which is supported by a bushing member 15 to be vertically moved, and the weight of the cathode electrode 4 itself including the head member 10 can act on the semiconductor substrate 6 such that the head member 10 is moved downward by the lifting member 17. The bushing member 15 for supporting the head member 10 has an adjusting mechanism 14, and it keeps the cathode electrode 14 and the semiconductor substrate 6 supported on the cup-like tank 2 through the substrate support member 18 to be horizontal. Therefore, a load on the semiconductor substrate 6 can be uniformed. Note that reference numeral 16 denotes a base plate. As shown in FIG. 1, the cathode electrode 4 has the same area as that of one surface of the semiconductor substrate 6. The cathode electrode 4 includes an elastic member 4b having a plurality of projections and made of rubber such as fluorine-contained rubber and a mesh-like cathode electrode 4a made of, e.g., a Pt mesh, and stretched on the lower surface of the elastic member 4b having the projections, such that the mesh-like cathode electrode 4a can be brought into uniform contact with the entire surface of the semiconductor substrate 6.

Note that the cathode electrode 4 may have a structure having an elastic force acting on the entire surface of the semiconductor substrate 6 and may be formed by, e.g., conductive rubber.

The adjusting mechanism 13 keeps the semiconductor substrate 6 on the cup-like tank 2 to be horizontal, and the adjusting mechanism 14 keeps the cathode electrode 4 to be horizontal. Therefore, the cathode electrode 4 can be brought into contact with the semiconductor substrate 6 such that the cathode electrode 4 is brought into uniform contact with the entire surface of the semiconductor substrate 6 to cause a load to uniformly act on the substrate 6.

Figure 3A:
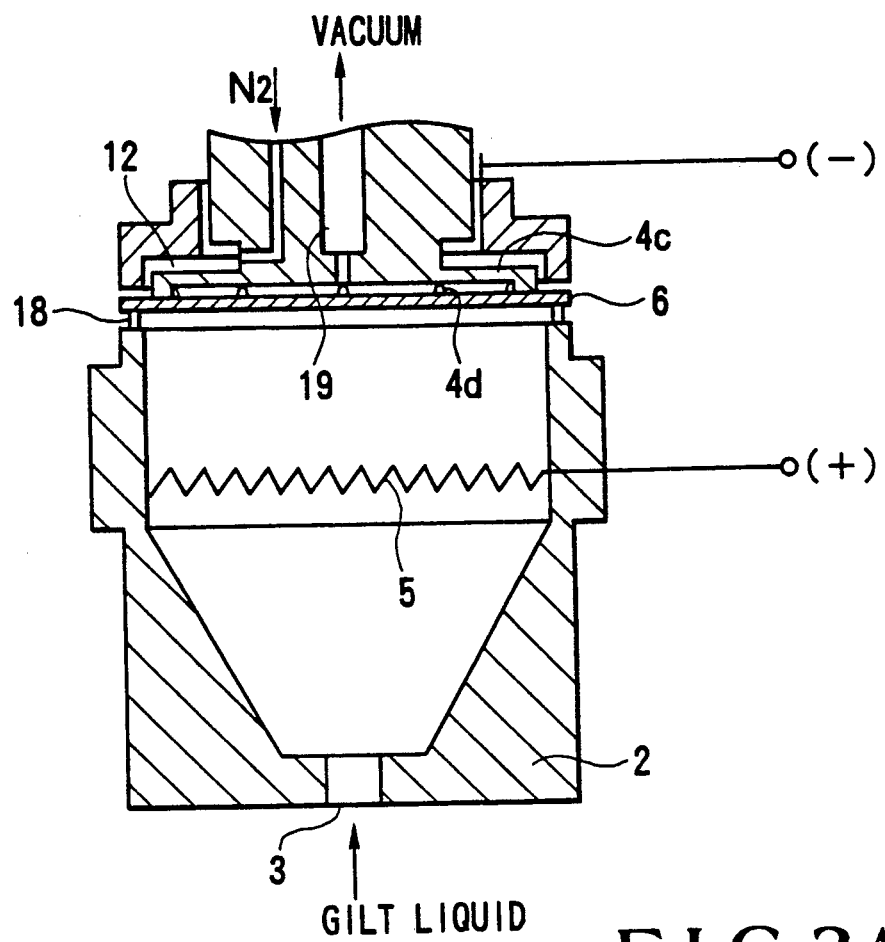
FIG. 3A is a sectional side view showing a gilding apparatus according to the second embodiment of the present invention.
Figure 3B:
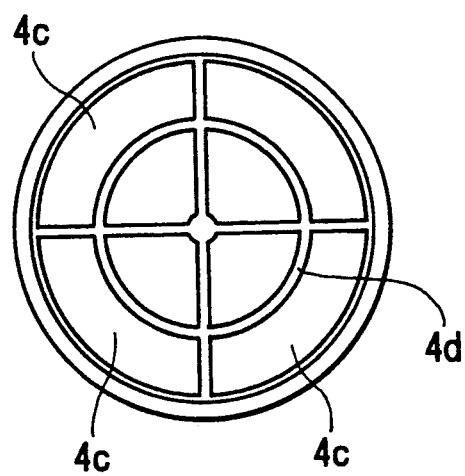
FIG. 3B is a view showing the bottom surface of a chuck member in FIG. 3A.
Figure 4A:
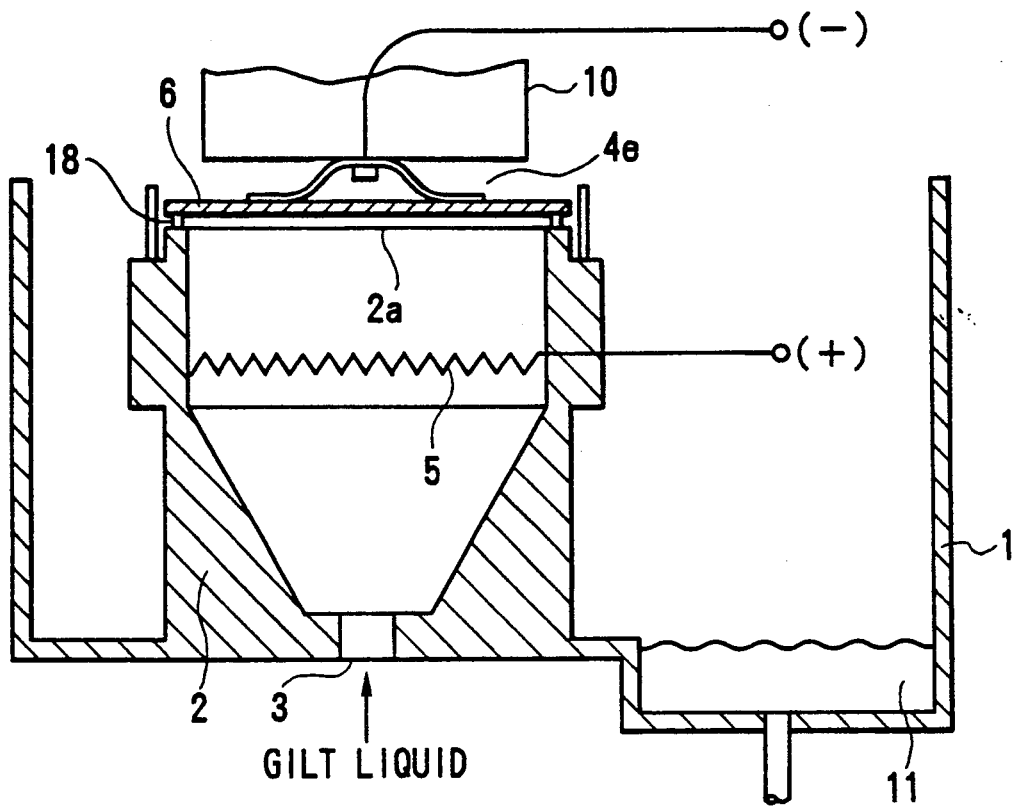
FIG. 4A is a sectional side view showing a conventional gilding apparatus.
Figure 4B:
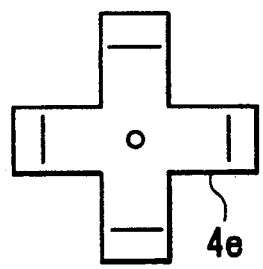
FIG. 4B is a front view showing a cathode electrode in FIG. 4A.
Figure 5:
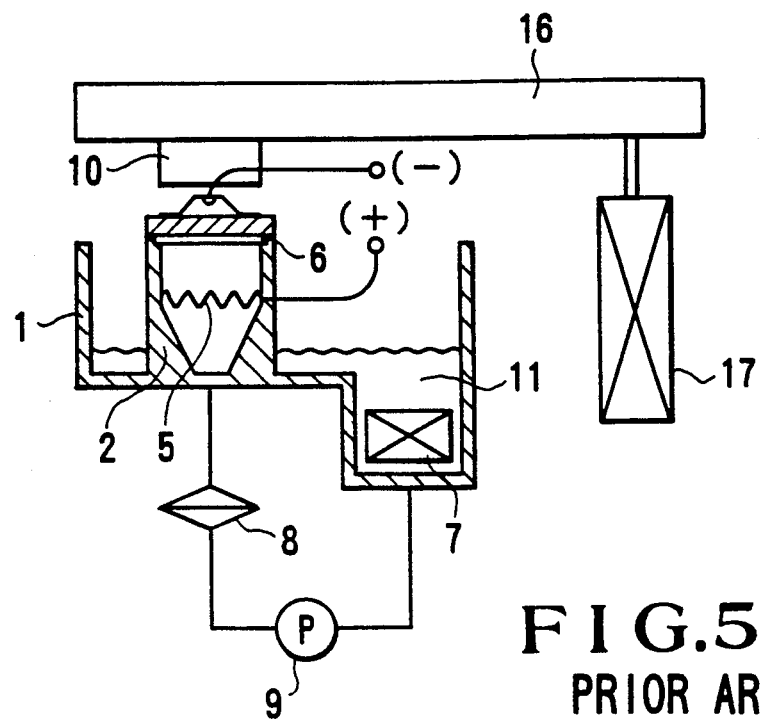
FIG. 5 is a view showing an overall arrangement of the conventional gilding apparatus.
Figure 6:
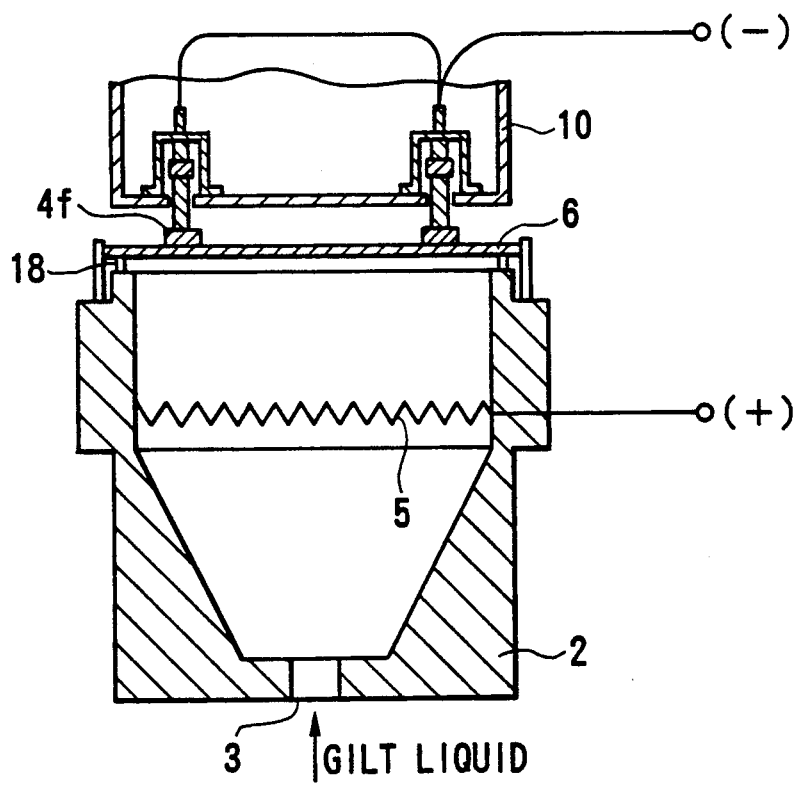
FIG. 6 is a sectional side view showing the conventional gilding apparatus.

FIG. 3A is a sectional side view showing the second embodiment of the present invention, and FIG. 3B is a bottom view showing a check member. In this embodiment, a flat, conductive, vacuum-chucking cathode electrode 4c having the same area as that of a semiconductor substrate 6 and cross-shaped, concentric vacuum-sucking grooves 4d for vacuum-chucking the semiconductor substrate 6 on the contact surface of the cathode electrode 4c are arranged. As in FIG. 2, the head member 10 is moved downward by a lifting mechanism member 17 on the semiconductor substrate 6, and the semiconductor substrate 6 is vacuum-chucked through tubes 19 arranged in the vacuum-chucking cathode electrode 4c. As in FIG. 2, since a cup-like tank 2 and an adjusting mechanism 14 arranged on a bushing member 15 of the chucking cathode electrode 4c keep a horizontal state, the chucking cathode electrode 4c can be brought into uniform contact with the almost entire surface of the semiconductor substrate 6. Reference numeral 12 denotes a circular positive-pressure groove. In this case, since it can be easily confirmed by arranging a vacuum switch on the vacuum tubes 19 whether the chucking cathode electrode 4 is brought into uniform contact with the almost entire surface of the semiconductor substrate 6, the reliability can be advantageously improved.

Figure 7A:
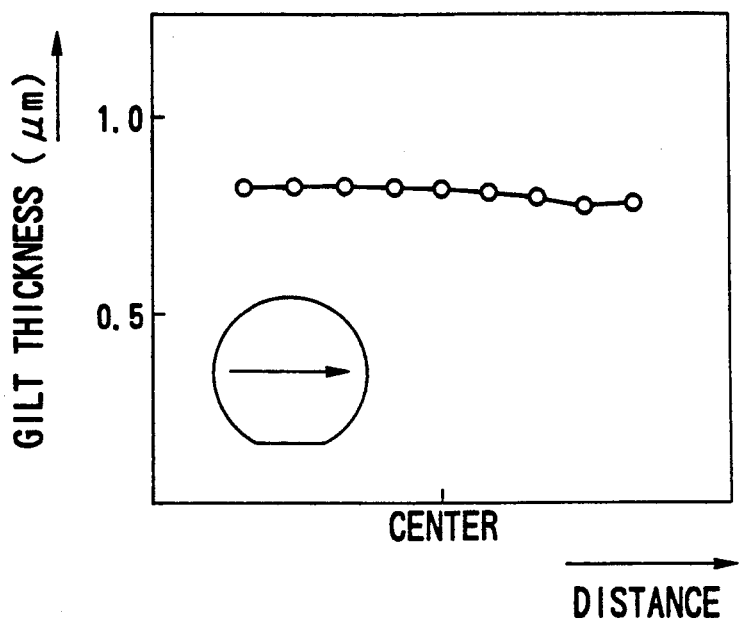
FIG. 7A is a graph showing a distribution of a gilt thickness on a semiconductor substrate when a gilding treatment is performed by a gilding apparatus according to the present invention.
Figure 7B:
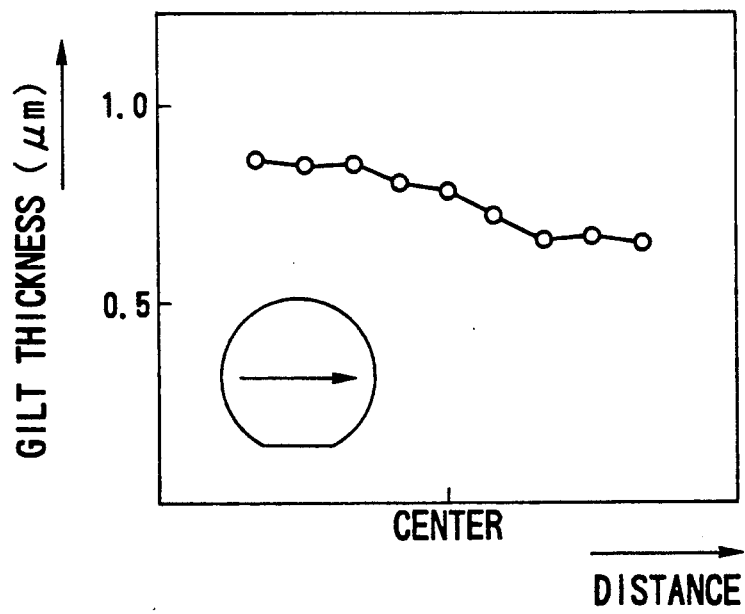
FIG. 7B is a graph showing a distribution of a gilt thickness when a gilding treatment is performed by a conventional gilding apparatus.

FIGS. 7A and 7B are graphs showing gilt thickness distributions when a gilding treatment is performed. FIG. 7B shows a case wherein a gilding treatment is performed by a conventional gilding apparatus. Referring to FIG. 7B, since a cathode electrode has variations in contact resistance, variations in gilt thickness are large. FIG. 7A shows a case wherein a gilding treatment is performed by a gilding apparatus of the present invention. Referring to FIG. 7A, variations in gilt thickness are decreased.

As described above, according to the present invention, a gilding apparatus has a mechanism in which a cathode electrode having the same area as that of a semiconductor substrate can be brought into reliable contact with the almost entire surface of the semiconductor substrate, thereby decreasing variations in contact resistance on the contact surface between the semiconductor substrate and the cathode electrodes. Therefore, variations in gilt thickness on a surface to be gilt of the semiconductor substrate can be decreased, and a gilding treatment can be performed at a high accuracy.

What is claimed is:

1. A gilding apparatus for a semiconductor substrate, said apparatus comprising:
   a cup-like tank for jetting a gilt liquid from a gilt liquid supply port formed in a bottom portion of said cup-like tank through an anode electrode;
   a substrate support member adapted for supporting a semiconductor substrate and having a lower surface to be treated, said support member being mounted close to an upper opening of said cup-like tank;
   a cathode electrode having an area which is the same as an area adapted to support said semiconductor substrate when said substrate is present and which is brought, from an upper direction, into contact with the semiconductor substrate mounted on said substrate support member; and
   an adjusting mechanism for keeping said cathode electrode relatively horizontal during times when said semiconductor is mounted on said substrate member.

2. An apparatus according to claim 1, wherein said cup-like tank and an outer tank therearound are independently arranged, and said adjusting mechanism keeps said substrate support member fixed to said cup-like tank to be horizontal.

3. An apparatus according to claim 1, further comprising a mechanism for adjusting a contact surface of said cathode electrode and said semiconductor substrate when it is supported by said substrate support member at a horizontal level.

4. An apparatus according to claim 1, further comprising a head member for supporting said cathode electrode and a lifting mechanism member for vertically moving said head member, and wherein the weight of said head member and said cathode electrode themselves move said lifting mechanism member downwardly in order to uniformly load said semiconductor substrate when is it present.

5. An apparatus according to claim 1, wherein said cathode electrode itself provides an elastic force against an entire surface of said semiconductor substrate when it is present.

6. An apparatus according to claim 1, wherein said cathode electrode comprises: an elastic member having an area which is the same as the area of said semiconductor substrate when it is present and a plurality of projections on a contact surface side; and a mesh-like cathode electrode stretched on an entire surface of said elastic member on the contact surface side.

7. An apparatus according to claim 1, wherein said cathode electrode comprises a flat vacuum-chucking cathode electrode having a contact area which is the same as the area of said semiconductor substrate which it is present and vacuum-chucks said semiconductor substrate through vacuum tubes arranged in said vacuum-chucking cathode electrode.

8. An apparatus according to claim 7, wherein said vacuum-chucking cathode electrode has a vacuum-chucking groove for vacuum-chucking said semiconductor substrate on the contact surface.

* * * * *